United States Patent
Seko

(10) Patent No.: US 7,671,454 B2
(45) Date of Patent: Mar. 2, 2010

(54) TAPE CARRIER, SEMICONDUCTOR APPARATUS, AND SEMICONDUCTOR MODULE APPARATUS

(75) Inventor: Toshiharu Seko, Yamatokoriyama (JP)

(73) Assignee: Sharp Kabushiki Kaisha, Osaka (JP)

(*) Notice: Subject to any disclaimer, the term of this patent is extended or adjusted under 35 U.S.C. 154(b) by 285 days.

(21) Appl. No.: 11/798,232

(22) Filed: May 11, 2007

(65) Prior Publication Data
US 2007/0262425 A1 Nov. 15, 2007

(30) Foreign Application Priority Data
May 12, 2006 (JP) ............... 2006-134426

(51) Int. Cl.
*H01L 23/495* (2006.01)
*H01L 21/50* (2006.01)

(52) U.S. Cl. ........................ 257/668; 438/123

(58) Field of Classification Search ................ 438/123, 438/411, 461, 611; 257/668, 676, E23.031–E23.059, 257/E23.004, E23.043
See application file for complete search history.

(56) References Cited

U.S. PATENT DOCUMENTS 6,437,253 B1   8/2002   Saito et al.
6,559,524 B2   5/2003   Seko
6,710,458 B2 * 3/2004   Seko ................... 257/778
7,221,041 B2 * 5/2007   Lin et al. .............. 257/666
2002/0043713 A1 4/2002 Seko

FOREIGN PATENT DOCUMENTS

| JP | 62-281341 | 12/1987 |
|---|---|---|
| JP | 3028413 | 2/2000 |
| JP | 2000-269611 | 9/2000 |
| JP | 2003-152024 | 5/2003 |

* cited by examiner

*Primary Examiner*—Calvin Lee
(74) *Attorney, Agent, or Firm*—Harness, Dickey & Pierce

(57) ABSTRACT

A tape carrier of the present invention includes an insulating tape and a wiring pattern formed on the insulating tape. The wiring pattern includes a connecting section via which the wiring pattern is connected to a bump electrode. The connecting section is provided at a part of an overlap part of the wiring pattern, which overlap part overlaps a semiconductor device when the semiconductor device is mounted on the wiring pattern. The connecting section of the wiring pattern is smaller in wiring width than the remaining part of the overlap part, which remaining part is other than the connecting section.

9 Claims, 5 Drawing Sheets

TAPE CARRIER, SEMICONDUCTOR APPARATUS, AND SEMICONDUCTOR MODULE APPARATUS

This Nonprovisional application claims priority under 35 U.S.C. §119(a) on Patent Application No. 134426/2006 filed in Japan on May 12, 2006, the entire contents of which are hereby incorporated by reference.

FIELD OF THE INVENTION

The present invention relates to a tape carrier for a COF semiconductor apparatus in which a semiconductor device is mounted on and bonded to a wiring pattern by use of a chip-on-film (COF) method. The present invention also relates to a COF semiconductor apparatus using the tape carrier, and a semiconductor module apparatus using the tape carrier.

BACKGROUND OF THE INVENTION

TCP (Tape Carrier Package) type semiconductor apparatuses (hereinafter, "TCP semiconductor apparatus") have conventionally been known as semiconductor apparatuses in which a semiconductor device is mounted on and coupled to a flexible printed circuit.

In recent years, COF type semiconductor apparatuses (hereinafter, "COF semiconductor apparatus) have been employed. In the COF semiconductor apparatus, a semiconductor device is mounted on and coupled to a flexible printed circuit by use of the COF method.

The following are exemplary differences between the TCP semiconductor apparatuses and the COF semiconductor apparatuses.

(i) In the TCP semiconductor apparatus, an opening section is made in advance in an insulating tape used as a base substrate of a flexible printed circuit. The opening section is utilized to mount a semiconductor device. A wiring pattern is formed in the opening section so as to protrude in the shape of a cantilever. A top end section of the wiring pattern is coupled to the semiconductor device. On the other hand, in the COF semiconductor apparatus, a thin film of an insulating tape, which is used as a base substrate in a flexible printed circuit, has no opening section to be utilized to mount a semiconductor device. The semiconductor device is mounted on and coupled to a wiring pattern formed on a front surface of the thin film of the insulating tape.

(ii) In the TCP semiconductor apparatus, the wiring pattern protrudes in the shape of a cantilever. This makes it difficult to produce a wiring pattern with a wiring pitch smaller than 45 μm. On the other hand, in the COF semiconductor apparatus, the wiring pattern is formed on the front surface of the thin film of the insulating tape. It is therefore easy to produce a wiring pattern with a wiring pitch of 35 μm or smaller.

(iii) The TCP semiconductor apparatus includes a slit along which the TCP semiconductor apparatus is to be folded after being mounted on a liquid crystal panel or the like. On the other hand, the COF semiconductor apparatus has no such slit. The COF semiconductor apparatus can be folded along any line of the thin film of the insulating tape.

(iv) The TCP semiconductor apparatus is produced by adhering, with a bonding agent, a copper foil to an insulating tape made of polyimide. On the other hand, the COF semiconductor apparatus is produced by applying polyimide or the like to a rear surface of a copper foil and then carrying out hardening to form the shape (casting). Alternatively, the COF semiconductor apparatus is produced by carrying out sputtering to form a layer of copper on the thin film of an insulating tape made of polyimide or the like (sputtering, metalizing).

As described above, in view of purposes of use, the COF semiconductor apparatus employs, as the base substrate in the flexible printed circuit, the thin film of the insulating tape that can be folded freely. Respective wirings of the wiring pattern provided on the front surface of the thin film of the insulating tape are electrically connected to corresponding terminals of the semiconductor device. A connector section for external connection is connected to a liquid crystal panel, a printed wiring board, and the like. Solder resist is applied to the remaining revealed part of the wiring pattern other than those mentioned above, thereby keeping the remaining revealed part insulated.

It is easier with the COF semiconductor apparatus to realize a finer pitch of the wiring pattern (inner lead) than with the TCP semiconductor apparatus. A lower limit of the wiring pitch in mass-produced TCP semiconductor apparatuses is 45 μm. On the other hand, mass production of COF semiconductor apparatuses with the wiring pitch of 35 μm has been carried out. With the COF semiconductor apparatuses, it is possible to realize a wiring pitch of 30 μm or smaller.

The COF semiconductor apparatuses have been demanded to be responsive to multi-pins, and at the same time, to become smaller and thinner. To meet the demands, the following are necessary. First, a pitch of the sections connecting the wiring patterns and the semiconductor devices needs to be finer. Further, a pitch of the connector sections of the wiring pattern for external connection needs to be finer. Furthermore, insulating tapes, wiring patterns, and the like need to be thinner. To make the pitches of the wiring patterns (inner lead) finer, the width and the thickness of the wiring patterns (inner lead) need to be reduced.

FIGS. 5 and 6 each show a schematic structure of the vicinity of a mount section (mount area) of a semiconductor device in a conventional general COF semiconductor apparatus. FIG. 5 shows a case in which the wiring pitch of the wiring pattern is 35 μm or greater. FIG. 6 shows a case in which the wiring pitch of the wiring pattern is smaller than 35 μm (in this case, the wiring pitch is finer than that in the case shown in FIG. 5). Hereinafter, the conventional case shown in FIG. 5 will be referred to as "conventional apparatus 1", and the conventional case shown in FIG. 6 will be referred to as "conventional apparatus 2".

As shown in FIGS. 5 and 6, the wiring pattern 23 in a flexible printed circuit for a conventional general COF semiconductor apparatus is formed in such a manner that a part of the wiring pattern 23, which part is indicated by the dashed double-dotted lines in FIGS. 5 and 6 and is to be connected to the bump electrode 25 of the semiconductor device 24, and the remaining part of the wiring pattern 23 have a same width (wiring width).

On the other hand, Patent Document 1 (U.S. Pat. No. 3,536,023; Date of Registration: Mar. 19, 2004; Date of Issue: Jun. 7, 2004) describes a known technique in which a width of a wiring pattern is partially changed. FIG. 7 shows a schematic structure of the vicinity of a mount section (mount area) of a semiconductor device in the COF semiconductor apparatus (hereinafter, "conventional apparatus 3") disclosed in Patent Document 1.

As shown in FIG. 7, in the conventional apparatus 3, the wiring pattern 23 is formed so as to have a wide width in the vicinity of an edge of the opening section 22a of the solder resist 22. The wiring pattern 23 has the same width throughout the overlap part (i.e. part on which the semiconductor device 24 is to be mounted), which is indicated by the dashed double-dotted line and overlaps the semiconductor device 24, including a part to be connected to the bump electrode 25 of the semiconductor device 24 and the remaining part of the wiring pattern 23.

As mentioned above, there have been demands for COF semiconductor apparatuses with wiring patterns having finer pitches, thinner films of insulating tapes, and thinner films of wiring patterns. There are, however, several obstacles in realizing finer pitches and thinner films.

One of the obstacles is that, because the pitch of the wiring pattern (inner lead) is small, a defect occurs if the bump electrode of the semiconductor device is displaced when bonded to the wiring pattern (inner lead). Specifically, the wiring pattern (inner lead) comes into contact with an adjacent bump electrode to the bump electrode.

In other words, in a COF semiconductor apparatus with a fine wiring pitch smaller than 35 μm, if the bump electrode of the semiconductor device is displaced when bonded to the wiring pattern, the defect is likely to occur that the wiring pattern (inner lead) comes into contact with an adjacent bump electrode to the bump electrode. This problem is more likely to occur in a COF semiconductor apparatus with a wiring pitch of 30 μm or smaller.

One way to overcome the obstacles is to narrow the wiring pattern (inner lead). This prevents the defect even if the bump electrode of the semiconductor device is displaced when bonded to the wiring pattern. Specifically, the wiring pattern is prevented from coming into contact with an adjacent bump electrode to the bump electrode. However, narrowing the width of the wiring pattern (inner lead) results in degrading mechanical strength of the wiring pattern and bond strength between the wiring pattern and the insulating tape. This causes a problem that the wiring pattern is easily disconnected or easily peels off in the steps from mounting and bonding the semiconductor device to packaging the COF semiconductor apparatus into a module.

The COF semiconductor apparatus can be folded freely. There is, however, difficulty in realizing a finer pitch while maintaining this characteristic of the COF semiconductor apparatus, that is, the COF semiconductor apparatus can be folded freely. Specifically, folding the COF semiconductor apparatus freely causes the wiring pattern to be easily disconnected or to peel off easily. Therefore, the wiring pattern (inner lead) having been made finer needs to improve in mechanical strength and bond strength.

The following describes the foregoing obstacles, with reference to the conventional apparatus 1 and the conventional apparatus 2.

FIG. 8 schematically shows a structure of the connecting section, via which the semiconductor device 24 is connected to the wiring pattern 23, in the COF semiconductor apparatus shown in FIG. 5 (conventional apparatus 1), in the case in which the bump electrode 25 of the semiconductor device 24 is displaced when bonded to the wiring pattern 23. FIG. 9 schematically shows a structure of the connecting section, via which the semiconductor device 24 is connected to the wiring pattern 23, in the COF semiconductor apparatus (conventional apparatus 2) shown in FIG. 6, in the case in which the bump electrode 25 of the semiconductor device 24 is displaced when bonded to the wiring pattern 23. FIG. 8 shows a structure in part B shown in FIG. 5. FIG. 9 shows a structure in part C shown in FIG. 6.

As shown in FIG. 8, the wiring pitch is wide in the conventional apparatus 1. Therefore, even if the bump electrode 25 is displaced when bonded to the wiring pattern 23, the defect is less likely to occur that the wiring pattern 23 comes into contact with an adjacent bump electrode to the bump electrode 25. Thus, even if the bump electrode 25 is displaced when bonded to the wiring pattern 23, the wiring pattern 23 and the bump electrode 25 are electrically connected in a suitable manner.

With the conventional apparatus 2, the defect is more likely to occur. Specifically, if the bump electrode 25 is displaced when bonded to the wiring pattern 23, the wiring pattern 23 comes into contact with an adjacent bump electrode 25 to the bump electrode 25, as shown in FIG. 6.

As described above, one way to overcome the defect mentioned above is to reduce the width of the wiring pattern 23 along with reducing the pitch of the wiring pattern 23.

FIG. 10 shows a COF semiconductor apparatus (hereinafter, "conventional apparatus 4") in which the width of the wiring pattern 23 is smaller than that of the wiring pattern 23 employed in the conventional apparatus 2 shown in FIG. 6.

As shown in FIG. 10, with the conventional apparatus 4, the defect is prevented even if the bump electrode 25 is displaced when connected to the wiring pattern 23 in the case in which the wiring pitch is reduced. Specifically, the wiring pattern 23 is prevented from coming into contact with an adjacent bump electrode 25 to the bump electrode 25.

However, narrowing the width of the wiring pattern 23 as shown in FIG. 10 results in degrading mechanical strength of the wiring pattern 23 and bond strength between the wiring pattern 23 and the insulating tape 21. This causes a problem that the wiring pattern 23 is disconnected or peels off.

FIG. 7 shows the invention disclosed in Patent Document 1 (conventional apparatus 3). According to Patent Document 1, in order to prevent disconnection of the wiring pattern 23 in the vicinity of the opening section 22a of the solder resist 22, which disconnection is likely to occur when different temperatures are applied repeatedly, the width (wiring width) of the wiring pattern 23 is greater in the vicinity of an edge of the opening section 22a of the solder resist 22 than in the connecting section (inner lead section) that electrically connects the wiring pattern 23 and the semiconductor device 24. Patent Document 1 makes, however, no particular mention of the width of the wiring pattern 23 in the inner lead section.

SUMMARY OF THE INVENTION

The present invention is in view of the foregoing problems, and has as an object to provide a tape carrier for COF semiconductor apparatuses, a COF semiconductor apparatus, and a semiconductor module apparatus, with all of which the following defect is preventable. Specifically, in a case in which a bump electrode is displaced when bonded to a wiring pattern, the wiring pattern is prevented from coming into contact with an adjacent bump electrode to the bump electrode that is supposed to be in contact with the wiring pattern. At the same time, the wiring pattern is prevented from being disconnected or peeling off.

To solve the above problems, a tape carrier of the present invention is adapted so that the tape carrier for a semiconductor apparatus in which a semiconductor device is mounted on and bonded to a wiring pattern by use of a chip-on-film method includes an insulating tape and the wiring pattern formed on the insulating tape, the wiring pattern including a connecting section via which the wiring pattern is connected to a bump electrode, the connection section being a part of an overlap part of the wiring pattern, which overlap part overlaps the semiconductor device when the semiconductor device is mounted on the wiring pattern, and the connecting section of the wiring pattern being smaller in wiring width than a remaining part of the overlap part of the wiring pattern, which remaining part is other than the connecting section.

With this structure, the connecting section of the wiring pattern is smaller in wiring pitch than the remaining part of the overlap part, which remaining part is other than the connecting section. This makes it possible to prevent the defect that, in the case in which the bump electrode is displaced when bonded to the wiring pattern, the wiring pattern is prevented from coming into contact with an adjacent bump electrode to the bump electrode that is supposed to be in contact with the wiring pattern.

Further, with the structure, the overlap part of the wiring pattern has a greater wiring width in the remaining part of the wiring pattern, which remaining part is other than the connecting section, than in the connecting section. This makes it possible to assure, or even improve, mechanical strength and bond strength that are necessary for the wiring pattern. Thus, the wiring pattern is prevented from being disconnected or peeling off.

Accordingly, with the structure, an advantage is produced that a tape carrier for COF semiconductor apparatuses is provided, with which tape carrier the wiring pattern and the bump electrode are electrically connected in a normal manner, and at the same time, the wiring pattern is prevented from being disconnected or peeling off.

The connecting section of the wiring pattern is a section provided for the bump electrode to be connected. The connecting section should not be interpreted as only including a part that is actually connected (in contact). In other words, the connecting section may include a part that is not actually connected to (in contact with) the bump electrode while the semiconductor device is being mounted.

Additional objects, features, and strengths of the present invention will be made clear by the description below. Further, the advantages of the present invention will be evident from the following explanation in reference to the drawings.

DESCRIPTION OF THE EMBODIMENTS

The following describes an embodiment of the present invention, with reference to FIGS. 1 to 4.

Figure 1:
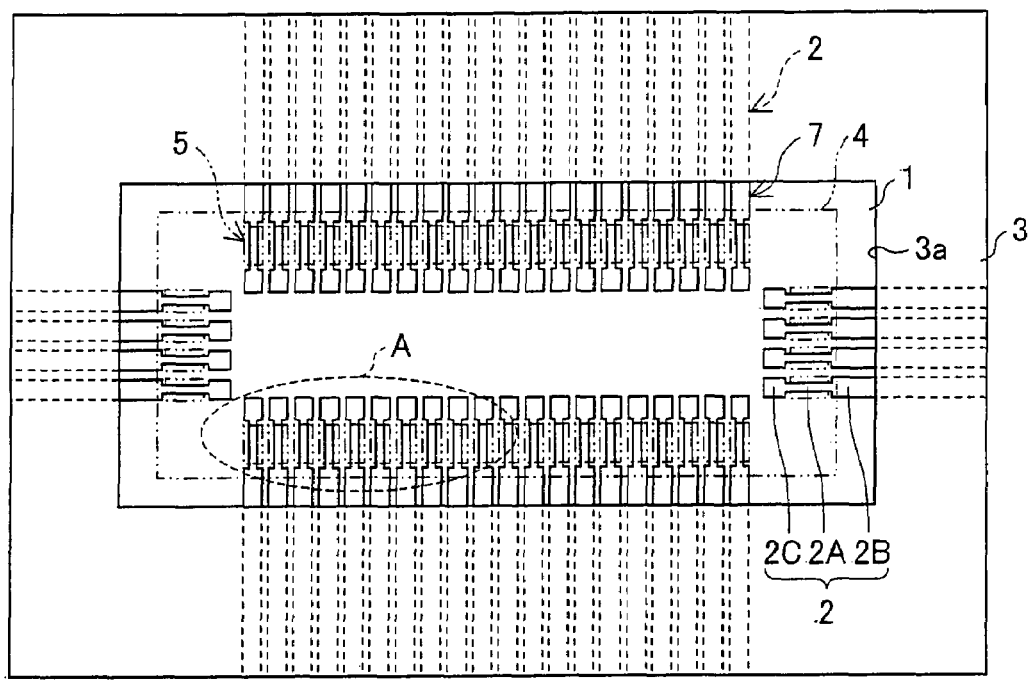
FIG. 1 is a plan view showing a schematic structure of the vicinity of a part of a COF semiconductor apparatus in accordance with an embodiment of the present invention, on which part a semiconductor device is mounted.
Figure 2:
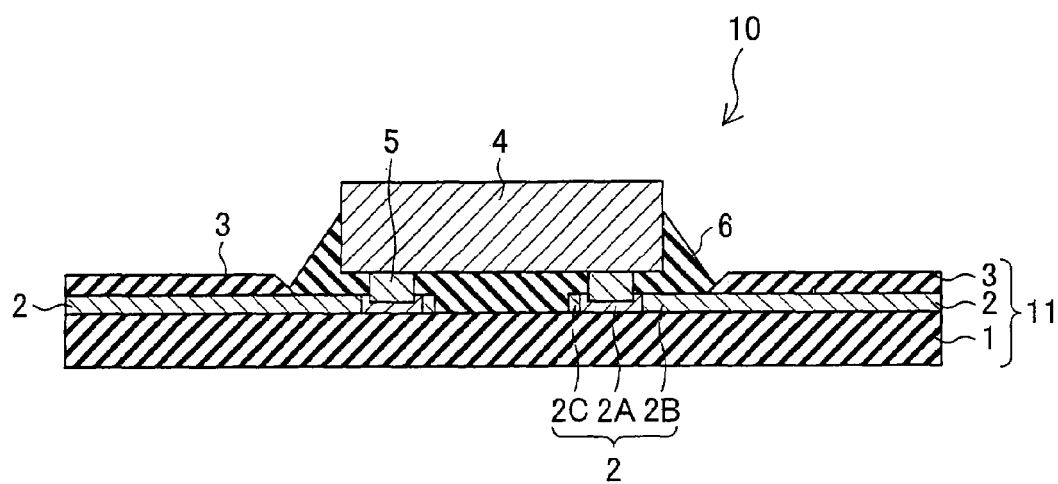
FIG. 2 is a sectional view showing a schematic structure of the vicinity of the part of the COF semiconductor apparatus shown in FIG. 1, on which part the semiconductor device is mounted.
Figure 4:
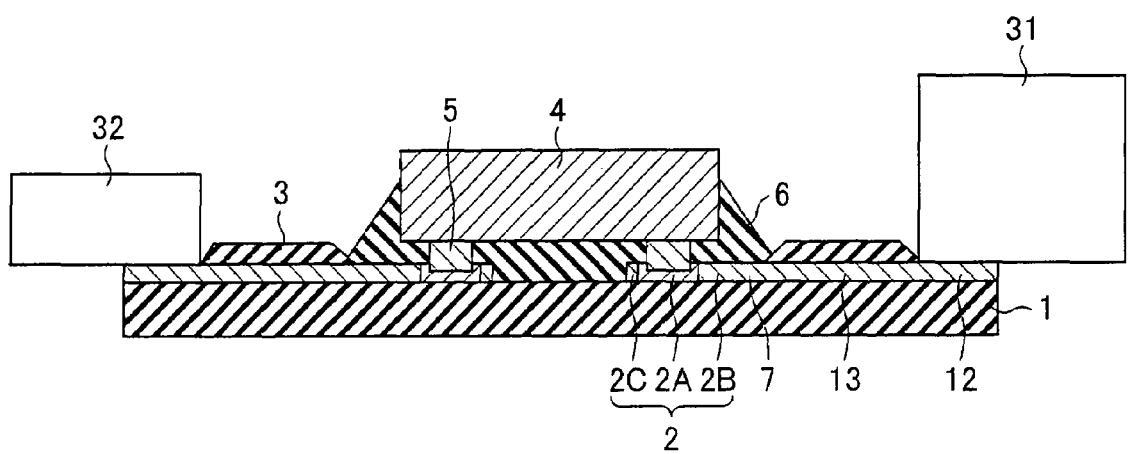
FIG. 4 is a sectional view showing a schematic structure of a semiconductor apparatus module including the COF semiconductor apparatus shown in FIGS. 1 and 2.
Figure 5:
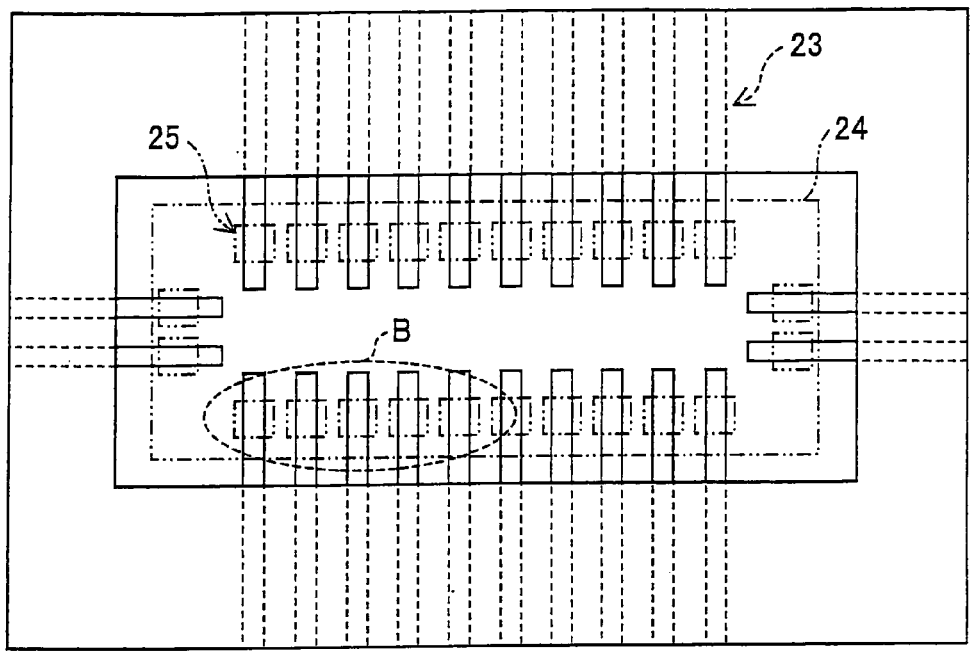
FIG. 5 is a plan view showing a schematic structure of the vicinity of a part of a COF semiconductor apparatus of a conventional apparatus 1, on which part a semiconductor device is mounted.
Figure 6:
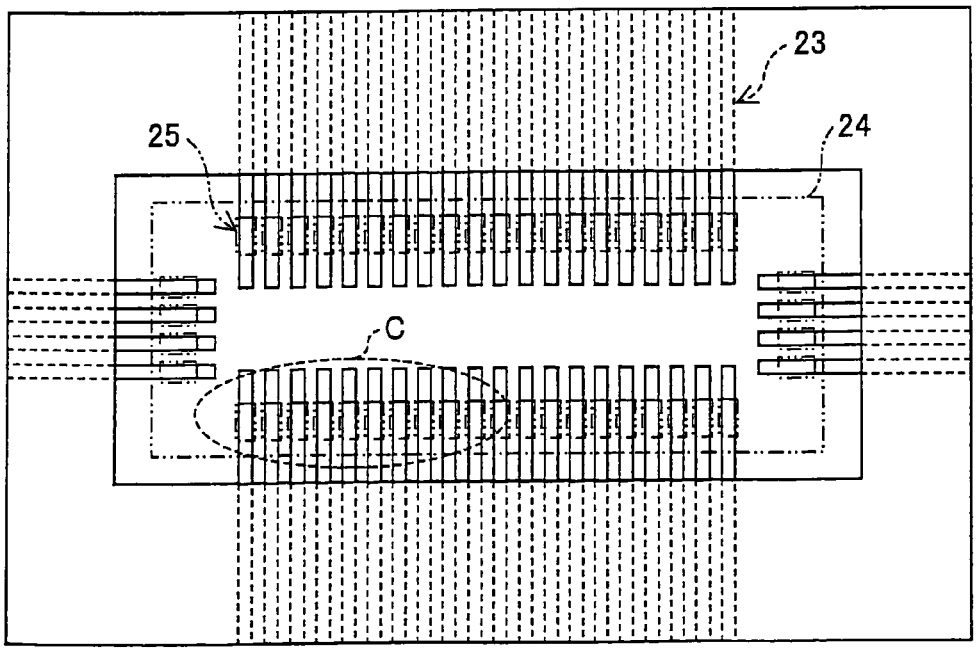
FIG. 6 is a plan view showing a schematic structure of the vicinity of a part of a COF semiconductor apparatus of a conventional apparatus 2, on which part a semiconductor device is mounted.
Figure 7:
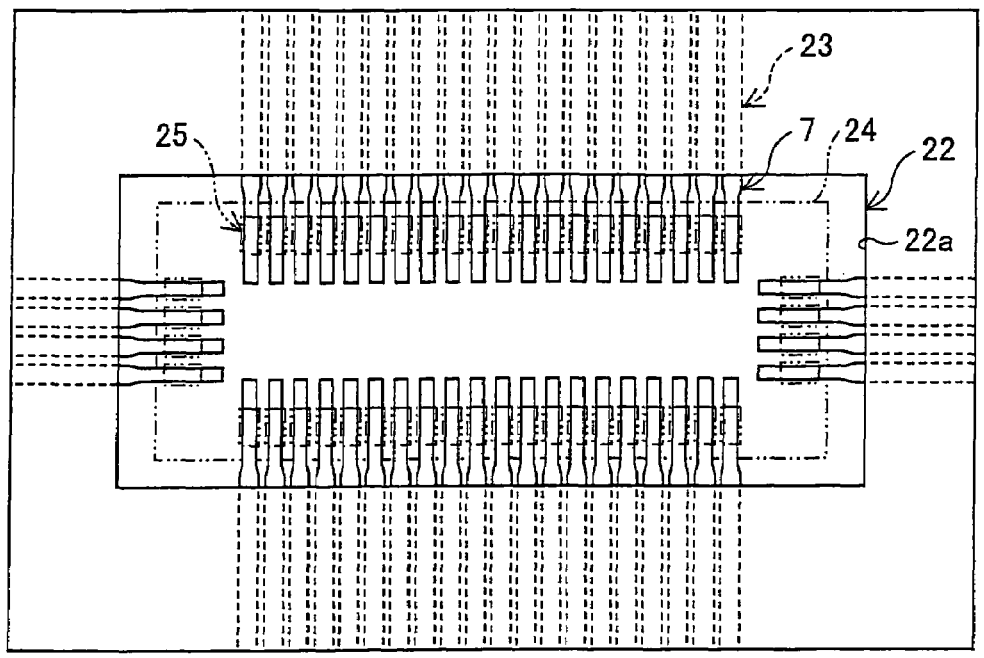
FIG. 7 is a plan view showing a schematic structure of the vicinity of a part of a COF semiconductor apparatus of a conventional apparatus 3, on which part a semiconductor device is mounted.
Figure 8:
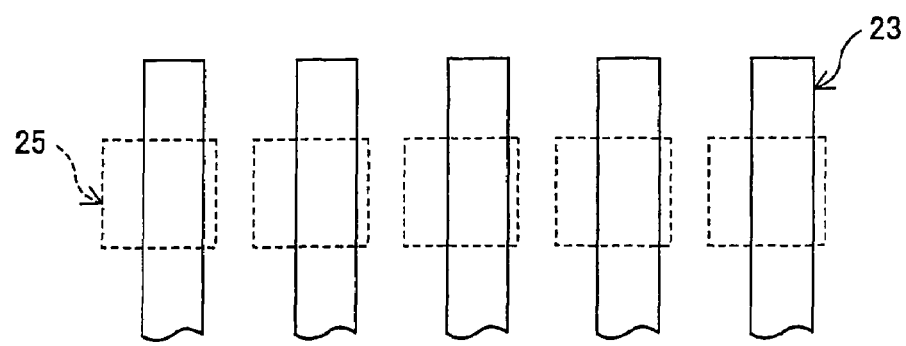
FIG. 8 is a figure schematically showing a structure of part B shown in FIG. 5, in a case in which a bump electrode of a semiconductor device is displaced when bonded to a wiring pattern in the conventional apparatus 1.
Figure 9:
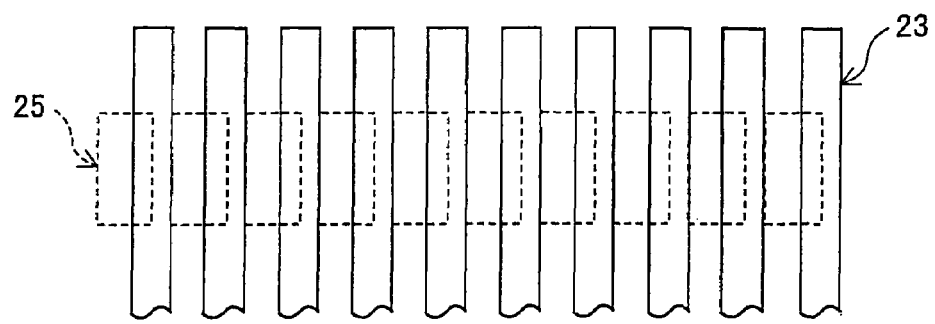
FIG. 9 is a figure schematically showing a structure of part C shown in FIG. 6, in a case in which a bump electrode of a semiconductor device is displaced when bonded to a wiring pattern in the conventional apparatus 2.
Figure 10:
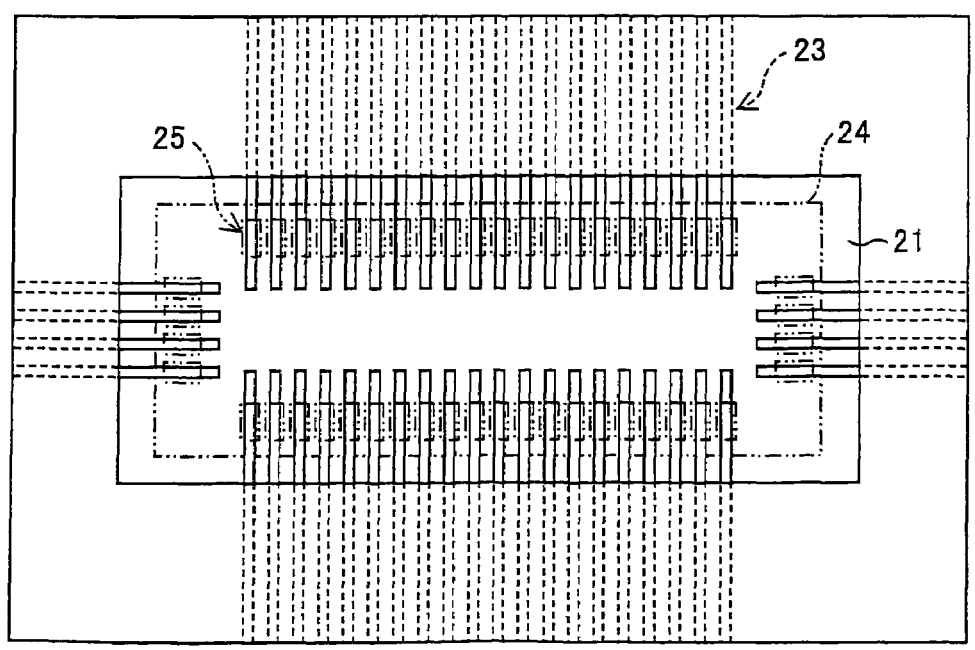
FIG. 10 is a plan view showing a schematic structure of the vicinity of a part of a COF semiconductor apparatus of a conventional apparatus 4, on which part a semiconductor device is mounted.

FIG. 1 is a plan view showing a schematic structure of the vicinity of a part of a COF semiconductor apparatus of the present embodiment, on which part (mount area) a semiconductor device is mounted. FIG. 2 is a sectional view showing a schematic structure of the vicinity of the part. FIG. 4 is a sectional view showing a schematic structure of a semiconductor module apparatus of the present embodiment, including the COF semiconductor apparatus shown in FIGS. 1 and 2. In FIG. 1, for convenience of description, the semiconductor device is indicated by a dashed double-dotted line, and the insulating resin is omitted.

As shown in FIGS. 1 and 2, the COF semiconductor apparatus (for convenience of description, this apparatus will be referred to simply as "semiconductor apparatus" hereinafter) 10 of the present embodiment includes a semiconductor device 4 and a tape carrier 11 (tape carrier for COF semiconductor apparatuses). The tape carrier is a flexible printed circuit.

The semiconductor device 4 is connected to the tape carrier 11. The semiconductor device 4 is mounted on the tape carrier 11. As shown in FIG. 2, a space in between the tape carrier 11 and the semiconductor device 4 is sealed with insulating resin 6. The present embodiment is described using, as an example, the COF semiconductor apparatus in which the semiconductor device 4 is mounted on the tape carrier 11.

The tape carrier 11 of the present embodiment includes an insulating tape 1, a wiring pattern 2, and a solder resist 3.

The insulating tape 1 is a base board (base substrate). The wiring pattern 2 is to be provided on a surface of the base board. The insulating tape 1 definitely needs to have an insulating property. The insulating tape 1 also needs to be freely bendable and highly supple (have flexibility) because it is used in various shapes. Thus, a thin film of an insulating tape having a thickness of 15 μm to 40 μm is preferable to be employed as the insulating tape 1. Resin materials such as polyimide, glass epoxy, and polyester are utilized to form the insulating tape 1. Although an exemplary case in which a polyimide-group insulating tape is used is described in the present embodiment, the present invention is not limited to this case.

As shown in FIG. 4, the wiring pattern 2, which is to be provided on the insulating tape 1, includes an inner lead 7, an outer lead 12, an intermediate lead 13, and the like. The inner lead 7 is a connecting section via which the wiring pattern 2 is connected to the semiconductor device. The outer lead 12 includes a connecting section (connector section for external connection) for external connection to a liquid crystal panel 31, a printed wiring board 32, and the like. The intermediate lead 13 is provided in between the inner lead 7 and the outer lead 12. The inner lead 7 is connected to the semiconductor device 4 at a semiconductor-device mount area (part of the insulating tape 1, which part overlaps the semiconductor device 4).

The wiring pattern 2 is formed by forming a copper foil on the insulating tape 1 by casting. Alternatively, the wiring pattern 2 is formed by carrying out sputtering (metalizing) or the like to form a layer of copper on the insulating tape 1 and then carrying out etching so that a desired pattern is formed. A surface of the wiring pattern 2 is plated with tin or gold, although this is not shown in the figures. The thickness of the wiring pattern 2 is set to, preferably, 5 μm to 18 μm.

The solder resist 3 is made of, for example, a heat-resistant cover material. The solder resist 3 prevents sections other than the connecting section from being revealed. The solder resist 3 therefore is formed on a part of the wiring pattern 2, which part includes neither of the semiconductor-device mount area and the connector section for external connection. In other words, the solder resist 3 is formed on a part of the wiring pattern 2, which part is revealed when the semiconductor device 4 and the like is mounted on and bonded to the tape carrier 11.

Exemplary semiconductor devices 4 include a CPU (Central Processing Unit) and an LSI (Large Scaled Integrated circuit) such as memories.

A bump electrode 5 electrically connects the semiconductor device 4 and the wiring pattern 2. When the semiconductor device 4 is mounted on the wiring pattern 2, the bump electrode 5 protrudes substantially vertically from a surface of the semiconductor device 4, which surface faces the wiring pattern 2. The bump electrode 5 only needs to be made of a conductive material. The shape of the bump electrode 5 is not particularly limited. It is, however, preferable that the shape allow the semiconductor device 4 to be bonded to the wiring pattern 2 easily. As shown in FIGS. 1 and 2, in the present embodiment, an electrode in the shape of a prism is employed as the bump electrode 5.

The insulating tape 1 employed in the present embodiment includes no opening section for mounting the semiconductor device 4. Therefore, the semiconductor device 4 is mounted on and bonded to the insulating tape 1 by coupling the bump electrode 5, which is provided to the semiconductor device 4, with the wiring pattern 2. In other words, the insulating tape 1 and the semiconductor device 4 are bonded together by bonding respective bump electrodes 5 of the semiconductor device 4 to corresponding wirings of the wiring pattern 2 provided on a front surface of the insulating tape 1. As a result, the semiconductor device 4 is electrically connected to the wiring pattern 2.

In the present embodiment, the wiring pattern 2 is formed in such a manner that a part of the wiring pattern 2, which part is connected to the bump electrode 5 of the semiconductor device 4, is smaller in width (wiring width) than the remaining part of the wiring pattern 2.

In other words, the wiring pattern 2 is formed in such a manner than a part of the wiring pattern 2, which part is the remaining part other than the part connected to the bump electrode 5 of the semiconductor device 4, is greater in wiring width than the part of the wiring pattern 2, which part is connected to the bump electrode 5 of the semiconductor device 4. In the present embodiment, the width of the wiring pattern 2 (wiring width) implies, concretely, the width of a top surface of the wiring pattern 2, which top surface is to be connected to the bump electrode 5.

As shown in FIG. 1, the wiring pattern 2 of the present embodiment includes a connecting section 2A (connecting part) via which the wiring pattern 2 is connected to the bump electrode 5. The connecting section 2A is at a part of the wiring pattern 2, which part overlaps the semiconductor device 4 (hereinafter, this part will be referred to simply as "overlap part"), The connecting section 2A is smaller in width (wiring width) than the remaining part of the wiring pattern 2. More specifically, the wiring pattern 2 includes, as shown in FIG. 1, the connecting section 2A having a smaller width (wiring width) than that of the remaining part (section 2B, section 2C) of the wiring pattern 2 (inner lead 7) in the overlap part.

The semiconductor device 4 is mounted on the inner lead 7 of the wiring pattern 2 in such a manner that the bump electrode 5 is placed on the connecting section 2A, which has a narrowest wiring width in the inner lead 7.

Figure 3:
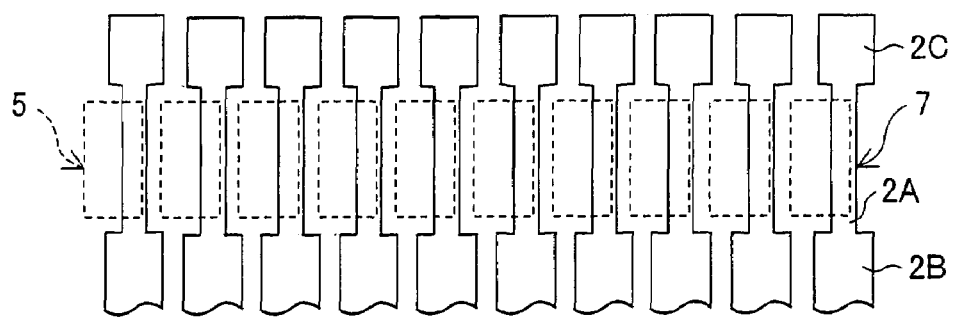
FIG. 3 is a figure schematically showing a structure of part A shown in FIG. 1, in a case in which a bump electrode of a semiconductor device is displaced when bonded to a wiring pattern in the COF semiconductor apparatus shown in FIGS. 1 and 2.

FIG. 3 schematically shows a structure of part A shown in FIG. 1, in a case in which the bump electrode 5 of the semiconductor device 4 is displaced when bonded to the wiring pattern 2 in the present embodiment.

As described above, the connecting section 2A formed so as to be smaller than the remaining part of the inner lead 7 (the remaining part corresponds to the sections 2B and 2C in the tape carrier 11 and the semiconductor apparatus 10 that are shown in FIGS. 1 to 3). This makes it possible to restrain the defect. Specifically, in a case in which the bump electrode 5 is displaced when bonded to the wiring pattern 2, a wiring pattern 2 (inner lead 7) is restrained from coming into contact with an adjacent bump electrode 5 to the bump electrode 5 that is supposed to be in contact with the wiring pattern 2. Therefore, the wiring pattern 2 (inner lead 7) and the bump electrode 5 are connected in a normal manner. At the same time, because the remaining part (i.e. sections 2B and 2C) of the inner lead 7 other than the connecting section 2A is formed so as to be greater than the connecting section 2A as described above, the wiring pattern 2 (inner lead 7) improves in mechanical strength and bond strength. This makes it possible to prevent the wiring pattern 2 (inner lead 7) from being disconnected or peeling off.

The inner lead 7 of the present embodiment is not particularly limited, as long as the inner lead 7 includes, as described above, the connecting section 2A via which the wiring pattern 2 (inner lead 7) is connected to the bump electrode 5, and a section greater in wiring width than the connecting section 2A. The connecting section 2A is provided at a part of the wiring pattern 2 (inner lead 7), which part faces the bump electrode 5 of the semiconductor device 4 when the semiconductor device 4 is mounted on the wiring pattern 2 (inner lead 7). The connecting section 2A is smaller in width (wiring width) than the remaining part of the wiring pattern 2 (inner lead 7). The inner lead 7 may include two or more sections having different wiring widths.

In the present embodiment, sections on both sides of the connecting section 2A are greater in width than the connecting section 2A. Specifically, in the overlap part, the connecting section 2A is sandwiched by a first section at a top end of the wiring pattern 2 and a second section at an outer edge of the semiconductor device 4. The first section is indicated as the section 2C. The second section is indicated as the section 2B. The first section and the second section are greater in width than the connecting section 2A, as shown in FIGS. 1 and 3. This makes it possible to improve the wiring pattern 2 in mechanical strength and bond strength.

The width of the connecting section 2A is not particularly limited, as long as the width is smaller than those of the sections 2B and 2C. It is, however, preferable that the width of the connecting section 2A satisfy formula (1) below $$a < 2c - b - 2|g| \tag{1}$$

where a is the width of the connecting section 2A, b is a width of the bump electrode 5, c is a wiring pitch, and ±g is a bonding accuracy.

When, for example, b=30 µm, c=40 µm, and g=15 µm, it is preferable that the width of the connecting section 2A be smaller than 20 µm.

If the wiring pattern 2 (inner lead 7) is formed in such a manner that the width of the connecting section 2A satisfies formula (1), the defect is prevented even if a positional displacement of the wiring pattern in the event that the semiconductor device 4 is bonded to the connecting section 2A reaches a maximum value calculated on the basis of the bonding accuracy. Specifically, the wiring pattern 2 is prevented from coming into contact with a bump electrode 5 that is supposed to be in contact with an adjacent wiring pattern 2 to the wiring pattern 2.

Further, it is preferable that the width of the connecting section 2A be smaller than or equal to a half of the width of the bump electrode 5.

If the width of the connecting section 2A is smaller than or equal to a half of the width of the bump electrode 5, the defect is more likely to be prevented, compared to the case in which the width of the connecting section 2A is greater than a half of the width of the bump electrode 5. Specifically, even if the bump electrode 5 is displaced when connected to the wiring pattern 2, the wiring pattern 2 is more likely to be prevented from coming into contact with a bump electrode adjacent to the bump electrode 5. A lower limit of the width of the connecting section 2A is not particularly limited, as long as mechanical strength required in the step of forming is obtainable with the width of the connecting section 2A. It is, however, preferable that the width be 1 µm or greater.

An upper limit of the width of the section 2B and an upper limit of the width of the section 2C are not particularly limited, as long as the wiring patterns 2 are not in contact. A lower limit of the width of the section 2B and a lower limit of the width of the section 2C are not particularly limited, as long as the lower limits are greater than the width of the connecting section 2A.

If, however, each of the width of the section 2B and the width of the section 2C is not greater than a half of the width of the bump electrode 5, the wiring pattern 2 is degraded in mechanical strength and bond strength, compared to a case in which each of the width of the section 2B and the width of the section 2C is greater than a half of the width of the bump electrode 5. Therefore, the defect is more likely to occur that the wiring pattern 2 is disconnected or peels off.

Accordingly, it is preferable that the width of the remaining part (section 2B, section 2C) of the inner lead 7 other than the connecting section 2A be greater than a half of the width of the bump electrode 5.

The sections 2B and 2C may have the same width or different widths.

Further, a lower limit of the length of the connecting section 2A is not particularly limited, as long as it is not smaller than the length of a part of the bump electrode 5, which part is in contact with the connecting section 2A. However, considering bonding accuracy in bonding the semiconductor device 4 to the wiring pattern 2, it is preferable that the length of the connecting section 2A satisfy formula (2) below $$e > f + 2|g| \qquad (2),$$

where e is the length of the connecting section (thin-wire section) 2A, f is a length of the bump electrode 5, and ±g is a bonding accuracy.

When, for example, f=80 µm and g=15 µm, it is preferable that the length e be greater than 110 µm.

In mounting the semiconductor device 4, the bump electrode 5 is placed in such a manner that the center of a part of the bump electrode 5, which part is in contact with the connecting section 2A, is aligned with the center of the connecting section 2A. Accordingly, it is preferable that the length (e) of the connecting section 2A include: the length of the bump electrode 5; a length greater than |g|, which length is along a direction from the bump electrode 5 toward a center of the semiconductor device 4 mounted on the tape carrier 11; and a length greater than |g|, which length is along a direction from the bump electrode 5 toward an outer edge of the semiconductor device 4 mounted on the tape carrier 11.

For example if bonding accuracy is ±15 µm, it is preferable that the length (e) of the connecting section 2A be greater than at least the length of the bump electrode 5 +30 µm. If the length of the connecting section 2A is shorter than the length of the bump electrode 5 +30 µm, the defect may occur if the bump electrode 5 is displaced when bonded to the wiring pattern 2, depending on the amount of this displacement. Specifically, the connecting section 2A may come into contact with an adjacent bump electrode 5 to the bump electrode 5 that is supposed to be in contact with the connecting section 2A.

An upper limit of the length (e) of the connecting section 2A is not particularly limited, as long as the length (e) satisfies the condition that a part (connecting section 2A) of the wiring pattern 2 (i.e. any one wiring pattern 2), which part constitutes a part of the overlap part and is utilized to bond the bump electrode 5 to the wiring pattern 2, is smaller in wiring width than the remaining part of the overlap part. In other words, the overlap part of the wiring pattern 2 includes both a part having a narrow wiring width and a part having a wide wiring width. Thus, inevitably, the upper limit of the length (e) of the connecting section 2A is smaller than the length of the overlap part of the wiring pattern 2 (length of the inner lead 7).

The longer the length (e) of the connecting section 2A is, the lower the mechanical strength and the bond strength of the wiring pattern 2 become. It is thus preferable that the length (e) of the connecting section 2A be close to f+2|g|. It is preferable that the length (e) be set to a length of f+2|g|, with a margin added. The margin should be sufficient for the sections 2B and 2C, which are the overlap part other than the connecting section 2A, not to be in contact with the bump electrode 5 when the semiconductor device 4 is displaced by a maximum amount of displacement.

To improve mechanical strength and bond strength of the wiring pattern 2, the section 2C may be provided so as to extend toward the center of the semiconductor device 4 in such a manner that the section 2C does not come into contact with another wiring pattern 2. For example, to prevent wiring patterns 2 extending in different directions from coming into contact with each other, a section 2C of some of the wiring patterns 2 provided in the overlap part may be formed larger than a section 2C of the other wiring patterns 2.

As shown in FIGS. 1 and 2, the tape carrier 11 of the present embodiment is produced by the following steps. First, a conductive layer is formed on the insulating tape 1. Then, patterning is carried out thereon, so that the wiring pattern 2 is formed on a front surface of the insulating tape 1. Thereafter, solder resist 3 is applied to a part of the tape carrier 11, which part is revealed when the semiconductor device 4 is mounted (more concretely, the part is the remaining part of the wiring part of the tape carrier 11 other than the connector section (outer lead 12) for external connection on the front surface of the insulating tape 1, on which connector section a terminal is to be formed, and a part on which the semiconductor device 4 is to be mounted), thereby producing the tape carrier 11.

Further, as shown in FIG. 2, the semiconductor apparatus 10 of the present embodiment is produced by the following steps. The semiconductor device 4 is provided within the opening section 3a in the solder resist 3. Then, the bump electrode 5 provided to the semiconductor device 4 is bonded to the wiring pattern 2 (inner lead section 7) inside of the opening section 3a, so that the semiconductor device 4 is mounted on and coupled to the tape carrier 11. Thereafter, a space in between the semiconductor device 4 and the tape carrier 11 is filled with insulating resin 6 so that sections connecting the semiconductor device 4 to the tape carrier 11 are sealed, thereby producing the semiconductor apparatus 10.

To use the semiconductor apparatus 10 as a semiconductor module apparatus, the outer lead 12 in the wiring pattern 2 is bonded to other electronic components such as a liquid crystal panel 31 and a printed wiring board 32. The electronic components (devices) to be bonded to the outer lead 12 are not limited to those exemplified electronic components, and may be changed in a manner responsive to the purposes of use of the semiconductor apparatus 10 and the semiconductor module apparatus obtained.

Equipments and methods for producing the tape carrier 11, the semiconductor apparatus 10, and the semiconductor module apparatus in accordance with the present invention are not particularly limited, and any equipments and methods that are currently generally employed to produce tape carriers for COF semiconductor apparatuses, semiconductor apparatuses using the tape carriers, and semiconductor module apparatus using the tape carriers.

The tape carrier 11 and the semiconductor apparatus 10 of the present embodiment are obtained in the foregoing manner. With the tape carrier 11 and the semiconductor apparatus 10, semiconductor module apparatuses are provided that are applicable to apparatuses for driving mobile phones, mobile information terminals, narrow displays, laptop computers, and the like.

The present invention is not limited to the description of the embodiments above, but may be altered by a skilled person within the scope of the claims. An embodiment based on a proper combination of technical means disclosed in different embodiments is encompassed in the technical scope of the present invention.

As described above, the tape carrier of the present invention includes a connecting section via which a wiring pattern is connected to a bump electrode. The connection section is a part of an overlap part of the wiring pattern, which overlap part overlaps the semiconductor device when the semiconductor device is mounted on the wiring pattern. The connecting section of the wiring pattern is smaller in wiring width than a remaining part of the overlap part of the wiring pattern, which remaining part is other than the connecting section. This makes it possible to prevent a defect even if the bump electrode is displaced when bonded to the wiring pattern. Specifically, the wiring pattern is prevented from coming into contact with an adjacent bump electrode to the bump electrode that is supposed to be in contact with the wiring pattern. Further, the remaining part of the wiring pattern in the overlap part, which remaining part is other than the connecting section, is greater in wiring width than the connecting section. This makes it possible to assure, or even improve, mechanical strength and bond strength that are necessary for the wiring pattern. Thus, the wiring pattern is prevented from being disconnected or peeling off.

Accordingly, with the foregoing structure, an advantage is produced that a tape carrier for a COF semiconductor apparatus is provided, via which tape carrier the wiring pattern and the bump electrode are electrically connected in a normal manner, and at the same time, the wiring pattern is prevented from being disconnected or peeling off.

It is preferable in the present invention that a wiring width of the connecting section of the wiring pattern satisfy formula (1) below $$a<2c-b-2|g| \quad (1),$$

where a is the wiring width of the connecting section, b is a width of the bump electrode, c is a wiring pitch, and ±g is a bonding accuracy.

With this structure, an advantage is produced that the defect is prevented even if a positional displacement of the wiring pattern in the event that the semiconductor device is bonded to the connecting section reaches a maximum value calculated on the basis of the bonding accuracy. Specifically, the wiring pattern is prevented from coming into contact with an adjacent bump electrode to the bump electrode that is supposed to be in contact with the wiring pattern.

It is preferable in the present invention that a length of the connecting section of the wiring pattern satisfy formula (2) below $$e>f+2|g| \quad (2),$$

where e is the length of the connecting section, f is a length of the bump electrode, and ±g is a bonding accuracy.

In the present invention, the lengths, i.e. the length of the wiring pattern (connecting section) and the length of the bump electrode, imply lengths in the direction in which the wiring pattern extends.

With this structure, an advantage is produced that the defect is prevented even if a positional displacement, along the direction in which the wiring pattern extends, of the wiring pattern in the event that the semiconductor device is bonded to the connecting section reaches a maximum value calculated on the basis of the bonding accuracy. Specifically, the wiring pattern is prevented from coming into contact with an adjacent bump electrode.

It is preferable in the present invention that the wiring pattern include a section on both sides of the connecting section of the wiring pattern, which section is greater in wiring width than the connecting section.

With this structure, an advantage is produced that the wiring pattern improves in mechanical strength and bond strength. Thus, the wiring pattern is prevented more effectively from being disconnected or peeling off.

It is preferable that the width of the connecting section of the wiring pattern be equal to or smaller than a half of the width of the bump electrode.

With this structure, an advantage is produced that the defect is prevented more effectively. Specifically, even if the semiconductor device is displaced (positional displacement of the semiconductor device that is bonded), along the width of the wiring pattern, when the bump electrode is bonded to the wiring pattern, the wiring pattern is prevented from coming into contact with an adjacent bump electrode to the bump electrode that is supposed to be in contact with the wiring pattern.

It is preferable that the wiring width of the remaining part is greater than a half of a width of the bump electrode; and the remaining part is not in contact with an adjacent wiring pattern.

With this structure, an advantage is produced that the wiring pattern improves in mechanical strength and bond strength, and that the wiring pattern is prevented from being disconnected or peeling off.

A semiconductor apparatus of the present invention includes the tape carrier of the present invention. This provides a COF semiconductor apparatus with which the pattern is prevented from coming into contact with an adjacent bump electrode even if the bump electrode is displaced when bonded to the wiring pattern, and at the same time, the wiring pattern is prevented from being disconnected or peeling off. In other words, a COF semiconductor apparatus is provided that is responsive to finer pitches, thinner films, and multi-pins.

To solve the above problems, the semiconductor apparatus of the present invention includes the tape carrier of the present invention.

With this structure, the semiconductor apparatus includes the tape carrier of the present invention. This provides a COF semiconductor apparatus with which the wiring pattern is prevented from coming into contact with an adjacent bump electrode even if the bump electrode is displaced when bonded to the wiring pattern, and at the same time, the wiring pattern is prevented from being disconnected or peeling off. In other words, a COF semiconductor apparatus is provided that is responsive to finer pitches, thinner films, and multi-pins. Accordingly, bonding defects that may occur in mounting and bonding the semiconductor devices are prevented. Further, it becomes possible to reduce defects such as disconnection and peeling-off of the wiring pattern, which defects occur until the step of packaging into modules, to 50% or lower, compared with conventional cases. This is an advantage.

A semiconductor module apparatus of the present invention includes the semiconductor apparatus. This produces an advantage of producing a semiconductor module apparatus with which the defects are prevented. Specifically, even if the bump electrode is displaced when bonded to the wiring pattern, the wiring pattern is prevented from coming into contact with an adjacent bump electrode to the bump electrode that is supposed to be in contact with the wiring pattern. At the same time, the wiring pattern is prevented from being disconnected or peeling off. The semiconductor module apparatus is applicable to apparatuses for driving mobile phones, mobile information terminals, narrow displays, laptop computers, and the like.

To solve the above problems, the semiconductor module apparatus of the present invention includes the semiconductor apparatus of the present invention.

With this structure, the semiconductor module apparatus includes the semiconductor apparatus of the present invention. This provides a semiconductor module apparatus with which the defects are prevented. Specifically, even if the bump electrode is displaced when bonded to the wiring pattern, the wiring pattern is prevented from coming into contact with an adjacent bump electrode to the bump electrode that is supposed to be in contact with the wiring pattern. At the same time, the wiring pattern is prevented from being disconnected or peeling off. The semiconductor module apparatus is applicable to apparatuses for driving mobile phones, mobile information terminals, narrow displays, laptop computers, and the like.

The tape carrier, the semiconductor apparatus, and the semiconductor module apparatus of the present invention are applicable to, for example, apparatuses for driving mobile phones, mobile information terminals, narrow displays, laptop computers, and the like.

The embodiments and concrete examples of implementation discussed in the foregoing detailed explanation serve solely to illustrate the technical details of the present invention, which should not be thinly interpreted within the limits of such embodiments and concrete examples, but rather may be applied in many variations within the spirit of the present invention, provided such variations do not exceed the scope of the patent claims set forth below.

What is claimed is:

1. A tape carrier for a semiconductor apparatus in which a semiconductor device is mounted on and bonded to a wiring pattern by use of a chip-on-film method, the tape carrier comprising:

an insulating tape, the wiring pattern being formed on the insulating tape, wherein the wiring pattern includes a connecting section having a bump electrode on a surface thereof, the connection section being a part of an overlap part of the wiring pattern, which overlap part overlaps the semiconductor device when the semiconductor device is mounted on the wiring pattern, and the connecting section of the wiring pattern being smaller in wiring width than a remaining part of the overlap part of the wiring pattern, which remaining part is other than the connecting section.

2. The tape carrier of claim 1, wherein the wiring width of the connecting section of the wiring pattern satisfies formula (1) below $$a < 2c - b - 2|g| \quad (1),$$

where a is the wiring width of the connecting section, b is a width of the bump electrode, c is a wiring pitch, and ±g is a bonding accuracy.

3. The tape carrier of claim 1, wherein a length of the connecting section of the wiring pattern satisfies formula (2) below $$e > f + 2|g| \quad (2),$$

where e is the length of the connecting section, f is a length of the bump electrode, and ±g is a bonding accuracy.

4. The tape carrier of claim 1, wherein the wiring pattern includes a section on both sides of the connecting section of the wiring pattern, which section is greater in wiring width than the connecting section.

5. The tape carrier of claim 1, wherein the width of the connecting section of the wiring pattern is smaller than or equal to a half of a width of the bump electrode.

6. The tape carrier of claim 1, wherein:
the wiring width of the remaining part is greater than a half of a width of the bump electrode; and
the remaining part is not in contact with an adjacent wiring pattern.

7. A semiconductor apparatus comprising a tape carrier of claim 1.

8. A semiconductor module apparatus comprising a semiconductor apparatus of claim 7.

9. The tape carrier of claim 1, wherein the connecting section is between the remaining part.

* * * * *